United States Patent
Bae et al.

(10) Patent No.: US 8,720,049 B2
(45) Date of Patent: May 13, 2014

(54) PRINTED CIRCUIT BOARD AND METHOD FOR FABRICATING THE SAME

(75) Inventors: Tae Kyun Bae, Gyunggi-do (KR); Chang Gun Oh, Gyunggi-do (KR); Ho Sik Park, Gyunggi-do (KR)

(73) Assignee: Samsung Electro-Mechanics Co., Ltd, Gyunggi-Do (KR)

( * ) Notice: Subject to any disclaimer, the term of this patent is extended or adjusted under 35 U.S.C. 154(b) by 358 days.

(21) Appl. No.: 13/009,789

(22) Filed: Jan. 19, 2011

(65) Prior Publication Data

US 2012/0097438 A1    Apr. 26, 2012

(30) Foreign Application Priority Data

Oct. 22, 2010 (KR) .................. 10-2010-0103392

(51) Int. Cl.
*H05K 3/20* (2006.01)

(52) U.S. Cl.
USPC ............ 29/831; 29/829; 29/830; 29/832; 29/840; 29/33 R; 174/258; 174/256; 174/257; 174/262; 174/266; 438/758; 438/584; 438/800; 438/106; 438/55; 257/528; 257/620; 257/700; 257/E21.5; 257/E21.51; 361/760; 361/783

(58) Field of Classification Search
USPC ......... 29/829, 830, 831, 832, 840, 852, 33 R; 174/258, 256, 257, 262, 266; 438/758, 438/584, 800, 106, 55; 257/528, 620, 700, 257/703, 758, E21.499, E21.5, E21.51; 361/760, 783
See application file for complete search history.

(56) References Cited

U.S. PATENT DOCUMENTS

| | | | | |
|---|---|---|---|---|
| 7,022,399 B2 * | 4/2006 | Ogawa et al. | | 428/209 |
| 7,765,686 B2 * | 8/2010 | Murakami et al. | | 29/831 |
| 7,981,722 B2 * | 7/2011 | Yamagata | | 438/106 |
| 8,315,060 B2 * | 11/2012 | Morikita et al. | | 361/748 |
| 8,351,215 B2 * | 1/2013 | Kim et al. | | 361/766 |
| 8,356,405 B2 * | 1/2013 | Oh et al. | | 29/830 |
| 2007/0126108 A1 * | 6/2007 | Yamazaki et al. | | 257/690 |
| 2010/0018762 A1 * | 1/2010 | Yoshimura et al. | | 174/262 |
| 2010/0101851 A1 * | 4/2010 | Muramatsu et al. | | 174/262 |

FOREIGN PATENT DOCUMENTS

JP    2010-034197    2/2010

OTHER PUBLICATIONS

Office Action from counterpart Korean Patent Application No. 10-2010-0103392, mailed Sep. 11, 2012 4 pages, English Summary included.

\* cited by examiner

*Primary Examiner* — Peter DungBa Vo
*Assistant Examiner* — Azm Parvez
(74) *Attorney, Agent, or Firm* — Bracewell & Giuliani LLP; Brad Y. Chin

(57) ABSTRACT

Disclosed herein is a method for fabricating a printed circuit board, including: stacking a second insulating layer including a reinforcement on an outer surface of a first insulating layer having a post via formed thereon; polishing an upper surface of the second insulating layer to expose an upper side of the post via; stacking a film member on the second insulating layer to cover the post via and compress the second insulating layer; polishing an upper surface of the film member to expose an upper side of the post via; and forming a circuit layer connected to the post via on the upper surface of the film member.

7 Claims, 4 Drawing Sheets

PRINTED CIRCUIT BOARD AND METHOD FOR FABRICATING THE SAME

CROSS REFERENCE TO RELATED APPLICATION

This application claims the benefit of Korean Patent Application No. 10-2010-0103392, filed on Oct. 22, 2010, entitled "Printed Circuit Board and Method for Fabricating the Same", which is hereby incorporated by reference in its entirety into this application.

BACKGROUND OF THE INVENTION

1. Technical Field

The present invention relates to a printed circuit board and a method for fabricating the same.

2. Description of the Related Art

A printed circuit board is a component transferring a signal, supplying power, and the like, through an electrical connection between electronic components. The printed circuit board has been developed to accept fineness of an active element and a semiconductor component and lightness and slimness of an electronic product, rather than being developed independently.

Interlayer connection scheme of the printed circuit board has changed from an existing scheme in which plating is performed after laser processing, for several purposes. Various shapes of vias is used, and a post via is used in order to reduce fabrication cost.

In order to fabricate the printed circuit board including the post via, the post via is formed by plating, prepreg is laminated thereon, and a surface polishing process is performed in order to expose the post via and planarize the printed circuit board.

After being subjected to the polishing process, glass fabric included in the prepreg is partially or entirely exposed on a surface of the printed circuit board. In the case of forming a seed layer through a chemical copper plating scheme in order to form another circuit layer on the prepreg having the exposed glass fabric, migration occurs due to low adhesion.

In order to solve this problem, a seed layer made of metal such as tin (Sn), titanium (Ti), and the like, has been formed by a sputtering scheme according to the prior art. However, in order to form the seed layer by the sputtering scheme, sputtering equipment and new metal materials are required. In addition, when performing an etching process in order to remove the seed layer made of the new metal materials, another component of etchant is required, such that investment cost and management item have been additionally generated.

SUMMARY OF THE INVENTION

The present invention has been made in an effort to provide a printed circuit board including a post via and having improved reliability of a circuit layer and predetermined strength.

Further, the present invention has been made in an effort to provide a method for fabricating a printed circuit board capable of forming a reliable circuit layer using an existing plating scheme rather than a sputtering scheme even though the circuit layers are interconnected through the post via.

A printed circuit board according to a first preferred embodiment of the present invention includes: a first insulating layer having a first circuit layer formed on an upper surface thereof; a second insulating layer stacked on the first insulating layer and including a reinforcement; a film layer stacked on the second insulating layer; a post via connected to the first circuit layer and passing through the second insulating layer and the film layer; and a second circuit layer formed on an upper surface of the film layer and connected to the post via.

The reinforcement may be composed of any one of glass fabric, paper, and glass nonwoven.

A method for fabricating a printed circuit board according to a second preferred embodiment of the present invention includes: stacking a second insulating layer including a reinforcement on an outer surface of a first insulating layer having a post via formed thereon; polishing an upper surface of the second insulating layer so as to expose an upper side of the post via; stacking a film member on the second insulating layer to cover the post via and compress the second insulating layer; polishing an upper surface of the film member to expose an upper side of the post via; and forming a circuit layer connected to the post via on the upper surface of the film member.

At the stacking the second insulating layer, a thickness of the second insulating layer may correspond to a height of the post via.

The forming the circuit layer may include: forming a seed layer connected to the post via on the upper surface of the film member; forming a plating layer on the seed layer; and patterning the seed layer and the plating layer.

The forming the seed layer may be performed by an electroless plating method.

The forming the plating layer may be performed by an electroplating method.

A method for fabricating a printed circuit board according to a third preferred embodiment of the present invention includes: stacking a second insulating layer including a reinforcement and a film member on an upper surface of a first insulating layer having a first circuit layer and a post via connected to the first circuit layer formed thereon; polishing an upper surface of the film member to expose an upper side of the post via; and forming a second circuit layer connected to the post via on the upper surface of the film member.

The film member may be bonded to an upper surface of the second insulating layer to be integrally formed therewith, and the film member and the second insulating layer may be simultaneously stacked on the upper surface of the first insulating layer.

At the stacking the second insulating member and the film member, a thickness of the second insulating layer becomes less than a height of the post via.

DESCRIPTION OF THE PREFERRED EMBODIMENTS

Figure 1:
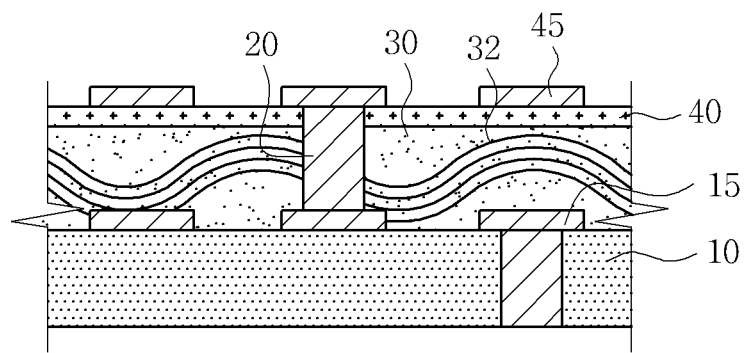
FIG. 1 is a cross-sectional view schematically showing a printed circuit board according to a preferred embodiment of the present invention.

Various features and advantages of the present invention will be more obvious from the following description with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, the detailed description thereof will be omitted.

Hereinafter, preferred embodiments of the present invention will be described in detail with reference to the accompanying drawings.

FIG. 1 is a cross-sectional view schematically showing a printed circuit board according to a preferred embodiment of the present invention. Hereinafter, a method for fabricating a printed circuit board according to the present embodiment will be described with reference to the figure.

The printed circuit board according to the present invention includes a first insulating layer 10 on which a first circuit layer 15 is formed. Prepreg, which is a resin layer made of phenol resin, epoxy resin, imide resin and the like or a resin layer including a reinforcement, may be used as the first insulating layer 10. In order to distinguish the insulating layer denoted by a reference numeral 10 from an insulating layer stacked in a subsequent process, it is referred to as "the first insulating layer". The first circuit layer 15 is formed on an upper surface of the first insulating layer 10, which is an optional insulating layer constituting an inner layer of a multi-layer printed circuit board.

In the case in which a circuit layer is formed on a lower surface of the first insulating layer 10 or another insulating layer and a circuit layer are formed on the lower surface of the first insulating layer 10, the first circuit layer 15 may be electrically connected thereto through a via.

A second insulating layer 30 including a reinforcement 32 is formed on the first insulating layer 15 on which the first circuit layer 15 is formed, and a film layer 40 is stacked on the second insulating layer 30.

The second insulating layer 30 includes the reinforcement to improve the strength of the printed circuit board. A glass fabric may be used as the reinforcement 32. Other reinforcements such as paper and glass nonwoven may also be used as the reinforcement 32.

The film layer 40 provides a planar surface in order to form a second circuit layer 45 connected to the first circuit layer 15. In the case in which the insulating layer including the reinforcement is polished to expose the reinforcement, the reliability of the circuit layer is lowered. In order to solve this problem, the film layer is used. Any one of the epoxy based Ajinomoto build up film (ABF), ASZ, or APL available from Sumitomo Bakelite Co., may be used as the film layer 40, which is a resin layer not including the reinforcement 32 such as glass fabric.

Since the second insulating layer 30 reinforces strength and the film layer 40 is used in order to provide a planar surface, a thickness of the second insulating layer 30 may be larger than that of the film layer 40.

The printed circuit board includes a post via 20 connected to the first circuit layer 15 and passing through the second insulating layer 30 and the film layer 40. Although the second insulating layer 30 and the film layer 40 through which the post via 20 passes has a constant thickness in FIG. 1, this is only a preferred embodiment. According to conditions of a fabrication process, as the second insulating layer 30 approaches the post via, the thickness thereof may be thicker. However, even in this case, a total thickness of the second insulating layer 30 and the film layer 40 may be preferably constant in order to provide the planar surface.

Also, as described above, the second circuit layer 45, which is formed on an upper surface of the film layer 40, is connected to the post via 20.

FIGS. 2 to 7 are cross-sectional views schematically showing a process of fabricating a printed circuit board according to a first embodiment of the present invention. Hereinafter, a method for fabricating a printed circuit board according to the present embodiment will be described with reference to the figures.

Figure 2:
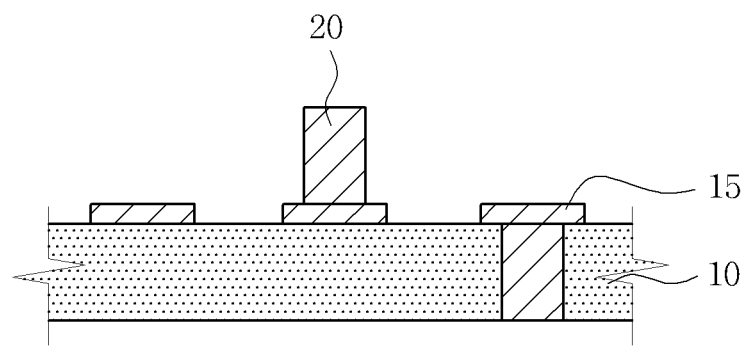
FIGS. 2 to 7 are cross-sectional views schematically showing a process of fabricating a printed circuit board according to a first embodiment of the present invention.
Figure 3:
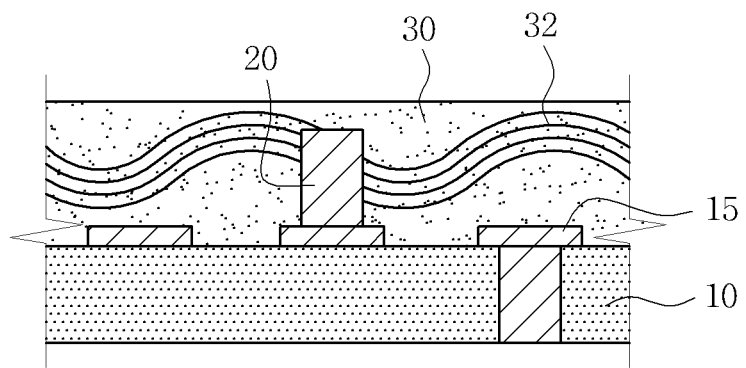

First, as shown in FIGS. 2 and 3, a second insulating layer 30 including reinforcement is stacked on an upper surface of a first insulating layer 10 on which a post via 20 is formed, the post via 20 being connected to a first circuit layer.

The post via 20 shown in FIG. 2 is fabricated by stacking a photoresist layer on the first insulating layer 10 on which the first circuit layer 15 is formed, forming a via hole therein by a photolithography scheme, and then plating or filling the via hole with metal such as copper. Of course, after the post via 20 is formed, the photoresist layer is removed.

A semi-hardened prepreg formed by penetrating thermosetting resin into glass fabric may be used as the second insulating layer 30 shown in FIG. 3.

At this time, a thickness of the second insulating layer 30 may more preferably corresponds to a height of the post via 20. After the second insulating layer 30 is stacked, it is polished so that one side of the post via 20 is exposed. In the case in which the thickness of the second insulating layer 30 is much larger than the height of the post via, a polishing process is delayed and a frequent replacement of an abrasive brush and the like is required. On the other hand, in the case in which the second insulating layer 30 has an excessively thin thickness, it does not satisfactorily perform the function of an insulating layer.

In the case in which the thickness of the second insulating layer 30 corresponds to the height of the post via 20, the purpose of exposing an upper side of the post via 20 through polishing in a degree of planarizing the upper surface of the second insulating layer 30 may be accomplished, thereby shortening fabrication time of the printed circuit board and improving productivity thereof.

Figure 4:
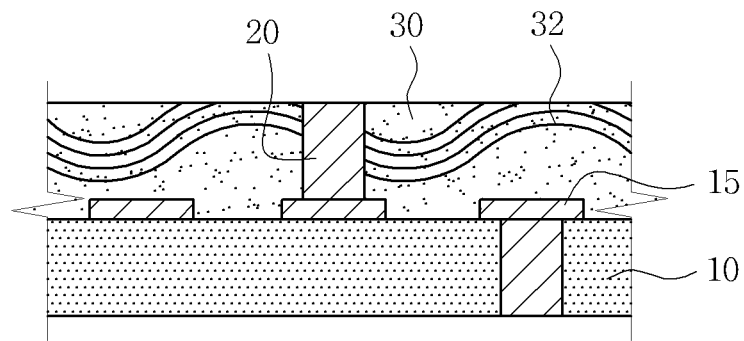

After the second insulating layer 30 is stacked on the first insulating layer 10, the upper surface of the second insulating layer 30 is polished so that the upper side of the post via 20 is exposed, as shown in FIG. 4.

Although a chemical polishing process may be performed in order to polish the second insulating layer 30, it is preferable that a mechanical polishing using an abrasive brush, an abrasive particle, or a jet scrub is performed.

Since the second insulating layer 30 includes the reinforcement 32 such as glass fabric, both of the upper side of the post via 20 and the reinforcement 32 such as glass fabric are simultaneously exposed to the outside through the polishing.

Figure 5:
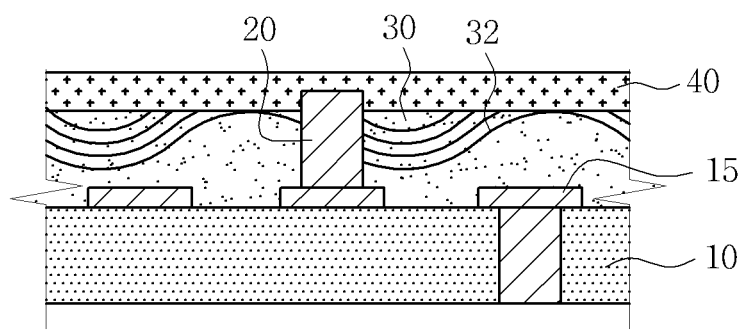

In the present invention, in order to form a reliable circuit layer even though the reinforcement 32 such as glass fabric is exposed to the outside of the second insulating layer, a film member 40 is stacked on the second insulating layer 30 so as to cover the post via 20 and compress the second insulating layer 30, as shown in FIG. 5.

In the case in which the reinforcement such as glass fabric is exposed on the upper surface of the insulating layer, if the circuit layer is formed on the insulating layer having the exposed reinforcement through a plating scheme, adhesion between the circuit layer and the insulating layer is lowered, thereby causing migration.

In order to solve this problem, a sputtering scheme has been used according to the prior art. However, the sputtering scheme has a complicated fabrication process and requires new equipment. In the present invention, the film member 40 is stacked on the second insulating layer 30, thereby making it possible to form a reliable circuit layer without using the new equipment.

In stacking the film member 40, a strong pressure is applied thereto so that the second insulating layer 30 is compressed. Accordingly, adhesion between the film member 40 and the second insulating layer 30 is increased, and the upper side of the post via 20 is impregnated into the film member 40.

Figure 6:
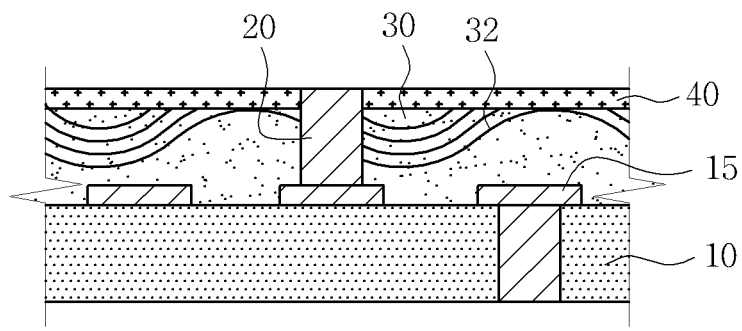

After the film member 40 is stacked, an upper surface of the film member 40 is polished so that the upper side of the post via 20 is exposed, as shown in FIG. 6.

Since the post via 20 is covered by the film member 40, a secondary polishing is performed so that the post via is connected to a circuit layer formed on the upper surface of the film member 40.

In the case in which a general printed circuit board includes the post via, the post via is formed in one insulating layer corresponding to the height of the post via. However, in the present invention, since a two-time stacking process and a two-time polishing process are performed, the post via 20 is formed between the circuit layers so as to penetrate through the second insulating layer 30 and the film member 40.

Figure 7:
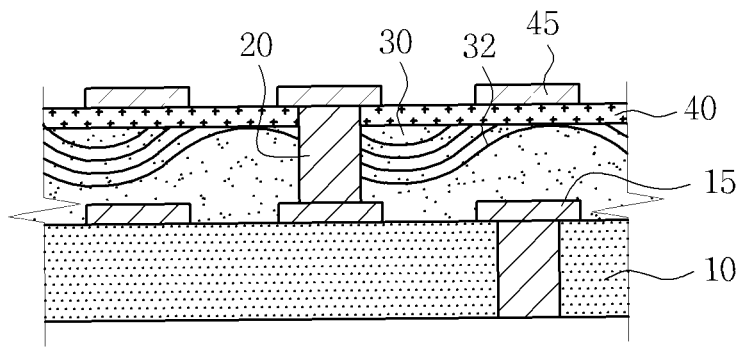

After the post via 20 is exposed, a second circuit layer 45 connected to the post via 20 is formed on the upper surface of the film member 40, as shown in FIG. 7.

The second circuit layer 45 may be formed by forming a seed layer connected to the post via 20 on the upper surface of the film member 40, forming a plating layer on the seed layer, and then patterning the seed layer and the plating layer.

While the seed layer has been formed through a sputtering process or a CVD process according to the prior art, the seed layer is formed through electroless plating according to the present invention. Then, the plating layer is formed on the seed layer through an electroplating method.

After the seed layer and the plating layer are formed, exposure and development processes are performed using a dry film. Then, the seed layer and the plating layer are patterned through an etching process to form the circuit layer.

In addition, the patterned plating layer may be formed by forming the seed layer, stacking a plating resist (a dry film, a liquid photoresist) on the seed layer, patterning the plating resist through exposure and development, and performing electroplating by supplying electricity to the seed layer so as to precipitate copper, and the like on the seed layer. Then, only an exposed seed layer is removed, thereby making it possible to form the circuit layer.

FIGS. 8 to 11 are cross-sectional views schematically showing a process of fabricating a printed circuit board according to a second embodiment of the present invention. Hereinafter, a method for fabricating a printed circuit board according to the present embodiment will be described with reference to the figures. However, a detailed description of a configuration corresponding to the method for fabricating a printed circuit board described with reference to FIGS. 2 to 7 will be omitted.

Figure 8:
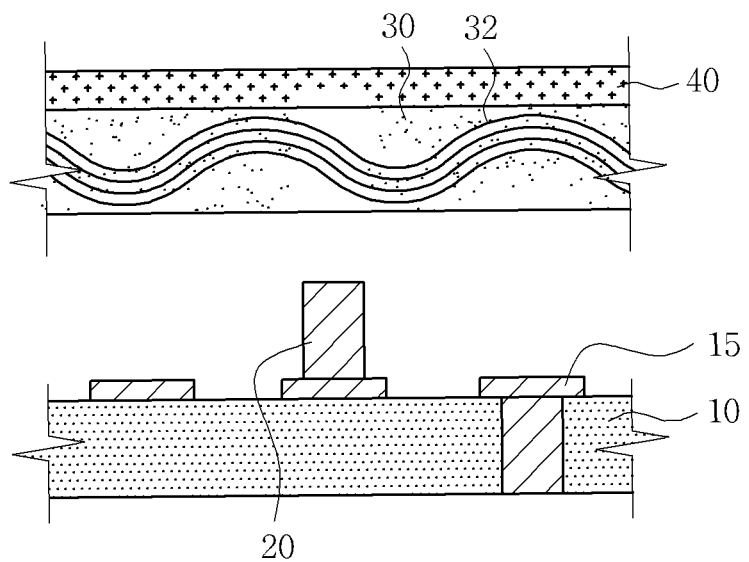
FIGS. 8 to 11 are cross-sectional views schematically showing a process of fabricating a printed circuit board according to a second embodiment of the present invention.

First, as shown in FIG. 8, a second insulating layer 30 including reinforcement 32 and a film member 40 are stacked on an upper surface of a first insulating layer 10 on which a post via 20 connected to a first circuit layer 15 is formed.

Figure 9:
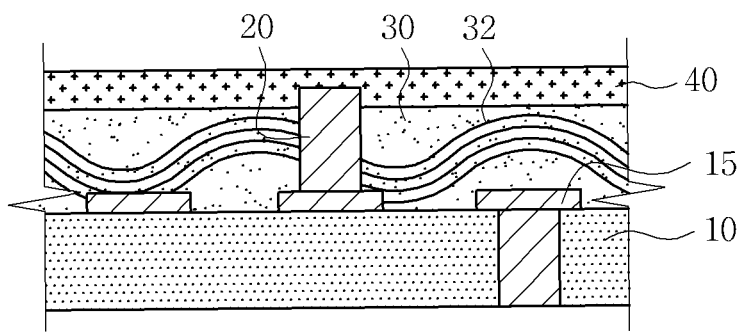

As shown in FIG. 9, the film member 40 is stacked on the second insulating layer 30, while compressing the second insulating layer 30 so that an upper side of the post via 20 is impregnated into the film member 40. Therefore, a thickness of the second insulating layer 30 becomes less than a height of the post via 20.

At this time, after the second insulating layer 30 such as a semi-hardened prepreg is stacked on the first insulating layer 10, the film member 40 may be stacked on the second insulating layer 30 in sequence. However, it is more preferable that the film member 40, which is bonded to an upper surface of the second insulating layer 30 to be integrally formed therewith, is stacked on the upper surface of the first insulating layer 10 simultaneously with the second insulating layer, as shown in FIGS. 8 and 9.

Unlike the first embodiment, in the method for fabricating a printed circuit board according to the present embodiment, the film member is stacked to compress the second insulating layer 30. Therefore, primary polishing may be omitted, such that a fabrication process is simplified and productivity is improved.

Figure 10:
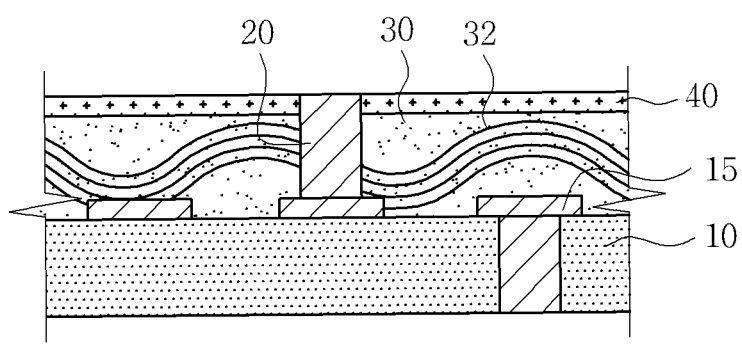

After the second insulating layer 30 and the film member 40 are stacked, an upper surface of the film member 40 is polished so that the upper side of the post via 20 is exposed, as shown in FIG. 10.

Figure 11:
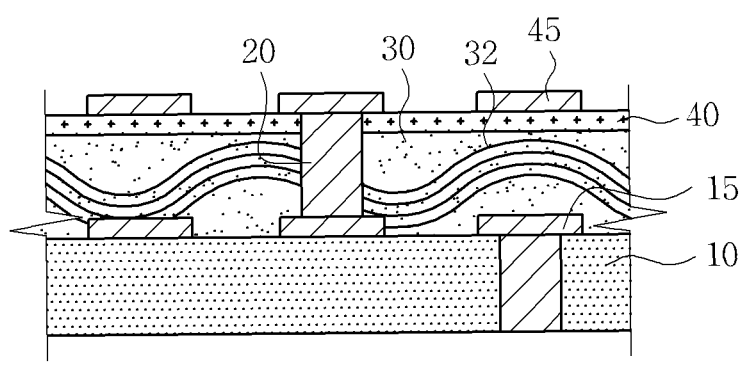

And, as shown in FIG. 11, a second circuit layer 45 connected to the upper side of the post via 20 is formed on the upper surface of the film member 40.

After the second circuit layer 45 is formed, a process for forming a buildup layer on an upper side of the second circuit layer 45 through a buildup process or forming a protective layer such as a solder resist may be further performed.

According to the preferred embodiment of the present invention, the printed circuit board includes the insulating layer including the reinforcement and the film layer disposed between the circuit layers connected through the post via, thereby making it possible to improve the strength of the printed circuit board and form a reliable circuit layer.

According to the preferred embodiment of the present invention, although the plating process is used without using a separate sputtering process, the method for fabricating the printed circuit board further includes a process for stacking the film member on the prepreg having the exposed glass fabric to provide a planar surface, by making it possible to form a reliable circuit layer, even using a plating process rather than a separate sputtering process.

Therefore, although the printed circuit board in which the circuit layers are connected through the post via is fabricated, the plating process is used without adopting a new scheme such as sputtering scheme, making it possible to reduce the fabrication costs of the printed circuit board.

It will become apparent to those skilled in the art that the present invention is not limited to the preferred embodiments as described above, but various modifications and variations are possible, without departing from the scope and spirit of the invention. Accordingly, these modifications and variations should be considered to be within the scope of the invention.

What is claimed is:

1. A method for fabricating a printed circuit board, comprising:

stacking a second insulating layer including a reinforcement on an upper surface of a first insulating layer having a first circuit layer and a post via connected to the first circuit layer formed thereon;

polishing an upper surface of the second insulating layer so as to expose an upper side of the post via;

stacking a film member on the second insulating layer to cover the post via and compress the second insulating layer so that a thickness of the second insulating layer becomes less than a height of the post via;

polishing an upper surface of the film member to expose an upper side of the post via; and forming a second circuit layer connected to the post via on the upper surface of the film member.

2. The method for fabricating a printed circuit board as set forth in claim 1, wherein at the stacking the second insulating layer, a thickness of the second insulating layer corresponds to a height of the post via.

3. The method for fabricating a printed circuit board as set forth in claim 1, wherein the forming the second circuit layer includes:

forming a seed layer connected to the post via on the upper surface of the film member;

forming a plating layer on the seed layer; and patterning the seed layer and the plating layer.

4. The method for fabricating a printed circuit board as set forth in claim 3, wherein the forming the seed layer is performed by an electroless plating method.

5. The method for fabricating a printed circuit board as set forth in claim 3, wherein the forming the plating layer is performed by an electroplating method.

6. A method for fabricating a printed circuit board, comprising:

stacking a second insulating layer including a reinforcement and a film member on an upper surface of a first insulating layer having a first circuit layer and a post via connected to the first circuit layer formed thereon;

polishing an upper surface of the film member to expose an upper side of the post via; and forming a second circuit layer connected to the post via on the upper surface of the film member;

wherein at the stacking the second insulating member and the film member, a thickness of the second insulating layer becomes less than a height of the post via.

7. The method for fabricating a printed circuit board as set forth in claim 6, wherein the film member is bonded to an upper surface of the second insulating layer to be integrally formed therewith, and the film member and the second insulating layer are simultaneously stacked on the upper surface of the first insulating layer.

* * * * *